US008670273B2

(12) United States Patent
Aritome et al.

(10) Patent No.: US 8,670,273 B2
(45) Date of Patent: Mar. 11, 2014

(54) METHODS FOR PROGRAM VERIFYING A MEMORY CELL AND MEMORY DEVICES CONFIGURED TO PERFORM THE SAME

(75) Inventors: Seiichi Aritome, Sungnam (KR); Soojin Wi, Icheon-si (KR); Angelo Visconti, Appiano Gentile (IT); Silvia Beltrami, Bartolomeo (IT); Christian Monzio Compagnoni, Olgiate Olona (IT); Alessandro Sottocornola Spinelli, Bergamo (IT)

(73) Assignee: Micron Technology, Inc., Boise, ID (US)

( * ) Notice: Subject to any disclaimer, the term of this patent is extended or adjusted under 35 U.S.C. 154(b) by 125 days.

(21) Appl. No.: 13/204,029

(22) Filed: Aug. 5, 2011

(65) Prior Publication Data

US 2013/0033937 A1    Feb. 7, 2013

(51) Int. Cl.
    *G11C 11/34*    (2006.01)
(52) U.S. Cl.
    USPC ............ 365/185.03; 365/185.22; 365/185.19; 365/185.24

(58) Field of Classification Search
    USPC .............. 365/185.03, 185.22, 185.19, 185.24
    See application file for complete search history.

(56) References Cited

U.S. PATENT DOCUMENTS

| 7,602,648 | B2  | 10/2009 | Lee |
| 7,602,652 | B2 * | 10/2009 | Kamei .................... 365/185.24 |
| 7,616,499 | B2 * | 11/2009 | Wan et al. ............... 365/185.22 |
| 7,706,190 | B2  | 4/2010  | Yang et al. |
| 7,710,781 | B2  | 5/2010  | Haque et al. |
| 7,885,120 | B2  | 2/2011  | Hung et al. |
| 2010/0246262 | A1 * | 9/2010 | Lee .......................... 365/185.03 |

\* cited by examiner

*Primary Examiner* — Vu Le
*Assistant Examiner* — Han Yang
(74) *Attorney, Agent, or Firm* — Leffert Jay & Polglaze P.A.

(57) ABSTRACT

A method for program verify is disclosed, such as one in which a threshold voltage of a memory cell that has been biased with a programming voltage can be determined and its relationship with multiple program verify voltage ranges can be determined. The program verify voltage range in which the threshold voltage is located determines the subsequent bit line voltage. The subsequent bit line voltage may be less than a previous bit line voltage used to program the memory cell.

24 Claims, 8 Drawing Sheets

METHODS FOR PROGRAM VERIFYING A MEMORY CELL AND MEMORY DEVICES CONFIGURED TO PERFORM THE SAME

TECHNICAL FIELD

The present invention relates generally to memory cells and in a particular embodiment the present invention relates to program verify in a memory cell.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

Operation of memory cells in electronic devices includes applying electrical signals to their terminals so as to modify the threshold voltage of the memory transistors in a finely controlled way. Data storage is obtained associating logical values to different possible ranges of threshold voltage. FIG. 1 shows a plot of word line voltage $V_{WL}$ versus time of typical prior art programming and verification operations. The figure shows the series of incrementally increasing programming pulses 101 being applied to a control gate of a target memory cell as the word line voltage $V_{WL}$. Each programming pulse 101 has a programming voltage $V_{pgm}$ that is increased by a step voltage from the previous programming pulse. Each programming pulse increases a charge level on charge trapping material (e.g., a floating gate) of the target memory cell, thereby increasing the cell's threshold voltage $V_t$. After each programming pulse 101, a verify pulse 102 occurs at a verify voltage $V_{vfy}$ to determine if the cell's threshold voltage has increased to the target level.

FIG. 2 shows the results of programming a number of memory cells using the programming/verify pulses of FIG. 1. The dotted line 200 represents a $V_t$ distribution prior to programming (e.g., erased) and the solid line 201 represents a final distribution of programmed memory cells at their target level. FIG. 2 shows that the initial distribution is moved as the threshold voltages of the memory cells are increased by the programming pulses.

Typical non-volatile memory cells can be programmed as single level memory cells (SLC), such as illustrated in FIG. 2, or multiple level memory cells (MLC). SLC memory cells store a single bit of information and are programmed from the erased state (e.g., logical 1) to a single programmed state (e.g., logical 0). MLC memory cells store two or more bits of information and are programmed from the erased state (e.g., logical 11) to one of multiple different programmed states (e.g., logical 01, 00, 10).

FIG. 3 shows a typical prior art diagram of $V_t$ distributions of four possible states available for data storage in MLC memory cells of an array (e.g., logical 11, 01, 00, 10). This figure shows the number of cells in each programmed or erased state versus the memory cells' threshold voltage $V_t$.

FIG. 3 shows that the logical 11 state 301 is the most negative state and is typically referred to as the erased state. The logical 10 state 302 is the most positive state. The logical 01 state 303 and the logical 00 state 304 are located between the most negative and most positive states 301, 302. Different encodings of the threshold voltage distributions into logical states are possible. The distributions of FIG. 3 are separated by margins 310, 311 between the states 303-304 and 304-302, respectively. Margins 310 and 311, and margin (not shown) between erased state 301 and first programmed state 303, allow to unambiguously assign a logical state (e.g., a bit pattern) to each memory cell, based on its threshold voltage value.

A typical non-volatile memory device has only a limited threshold voltage range, referred to in the art as a window margin, in which the programmed states have to fit. Thus, the greater the number of possible programmable states in a memory device, the tighter the $V_t$ distributions have to be in order to remain within the window margin and still maintain margins between the states. In an SLC memory device, a $V_t$ distribution enlargement does not typically affect the reading of a programmed memory cell. However, in an MLC memory device, enlarged $V_t$ distributions might overlap and result in errors in reading the different programmed states.

For the reasons stated above, and for other reasons stated below that will become apparent to those skilled in the art upon reading and understanding the present specification, there is a need in the art to tighten threshold voltage distributions in a memory device.

DETAILED DESCRIPTION

Figure 1:
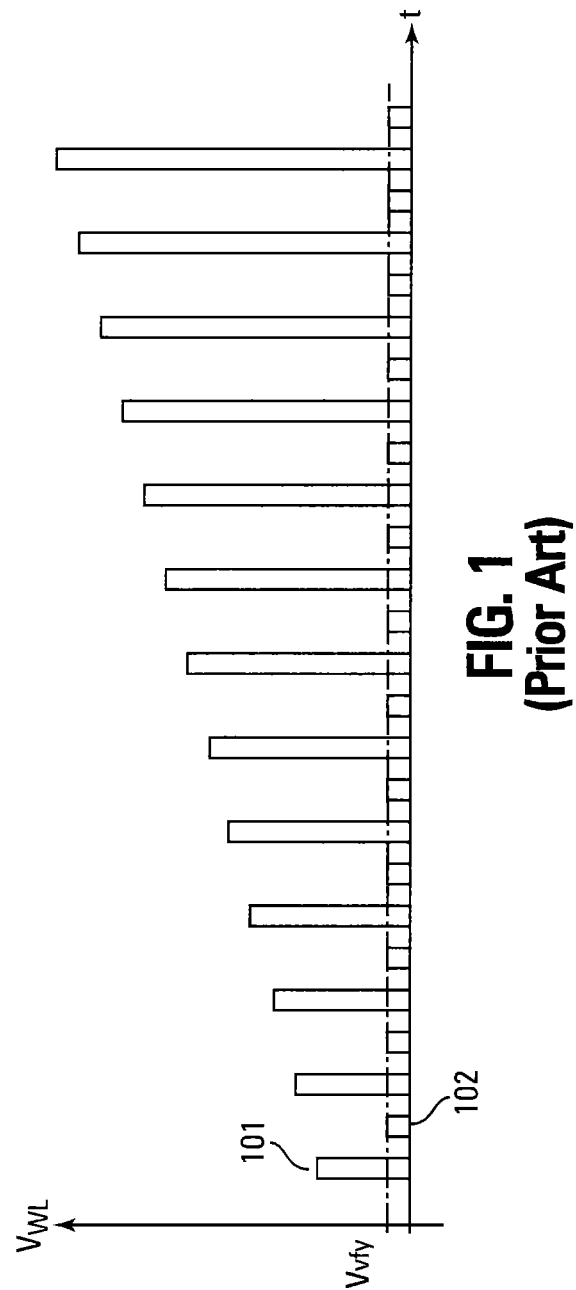
FIG. 1 shows a plot of word line voltage $V_{WL}$ versus time t of a typical prior art programming operation.
Figure 2:
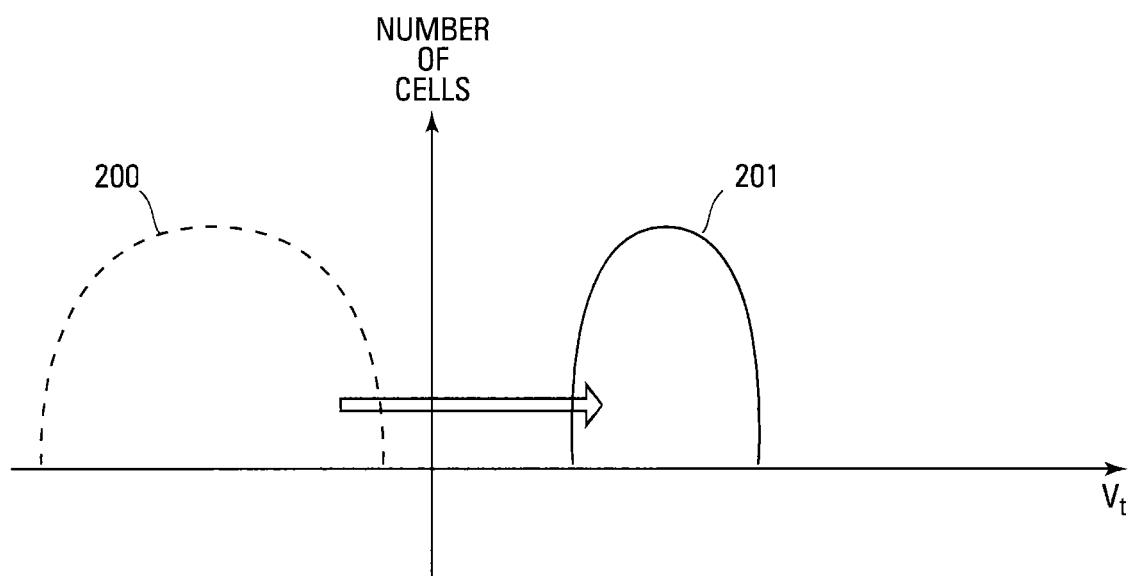
FIG. 2 shows typical prior art threshold voltage $V_t$ distributions of an SLC memory device in accordance with the programming operation of FIG. 1.
Figure 3:
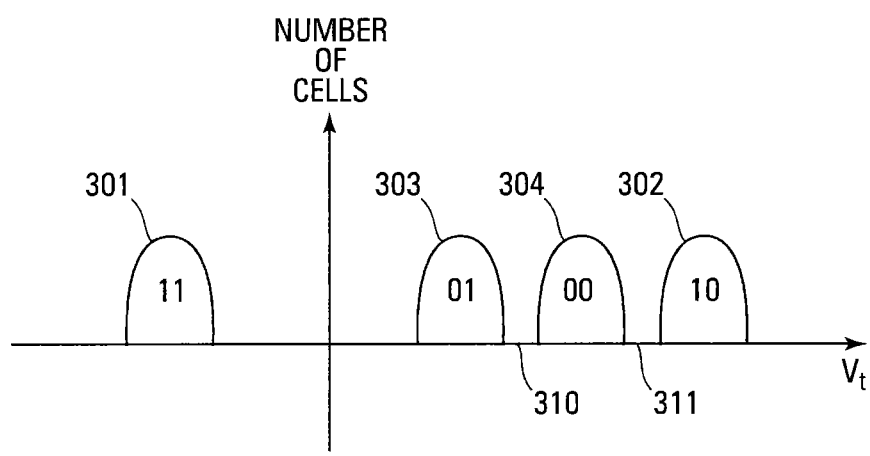
FIG. 3 shows typical prior art threshold voltage $V_t$ distributions of an MLC memory device.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 4:
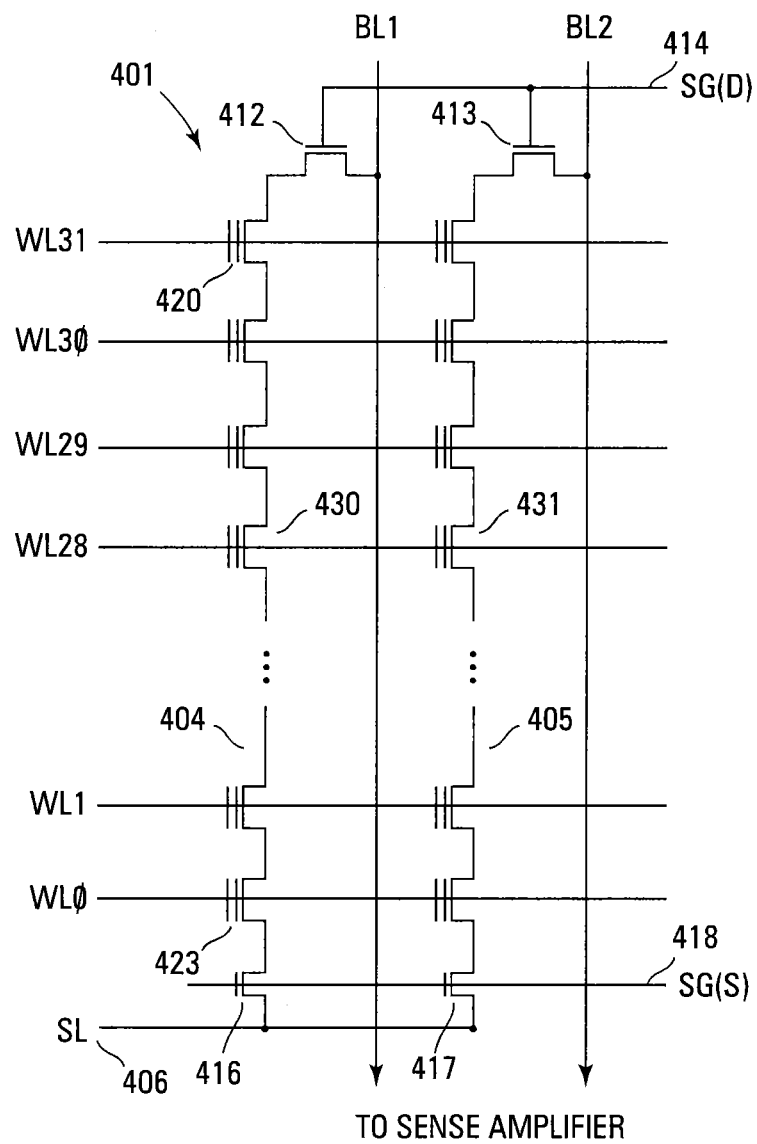
FIG. 4 shows a schematic diagram of one embodiment of a portion of a memory array.

FIG. 4 illustrates a schematic diagram of a portion of a NAND architecture memory array 401 comprising series strings of non-volatile memory cells on which the embodiments of a method for four level program verify can operate.

While the subsequent discussions refer to a NAND memory device, the present embodiments are not limited to such an architecture but can be used in other memory device architectures as well.

The array comprises an array of non-volatile memory cells 401 (e.g., floating gate or charge trap transistors) arranged in columns such as series strings 404, 405. Each of the cells 401 is coupled drain to source in each series string 404, 405. An access line (e.g. word line) WL0-WL31 that spans across multiple series strings 404, 405 is connected to the control gates of each memory cell in a row in order to bias the control gates of the memory cells in the row. Data lines, such as bit lines BL1, BL2 are coupled to the strings and eventually connected to sense amplifiers (not shown) that detect the state of each cell by sensing current or voltage on a particular bit line.

Each series string 404, 405 of memory cells is coupled to a source line 406 by a source select gate 416, 417 and to an individual bit line BL1, BL2 by a drain select gate 412, 413. The source select gates 416, 417 are controlled by a source select gate control line SG(S) 418 coupled to their control gates. The drain select gates 412, 413 are controlled by a drain select gate control line SG(D) 414.

Each memory cell can be programmed as SLC memory or MLC memory. Each cell's threshold voltage is indicative of the data that are stored in the cell. For example, in an SLC, a $V_t$ of 0.5V might indicate a programmed cell while a $V_t$ of −0.5V might indicate an erased cell. The MLC uses multiple $V_t$ ranges that each indicate a different state. Multilevel cells can take advantage of the analog nature of a traditional flash cell by assigning a bit pattern to a specific voltage range stored on the cell. This technology permits the storage of more than one bit per cell (e.g., two bits per cell or more), depending on the quantity of voltage ranges assigned to the cell.

Figure 5:
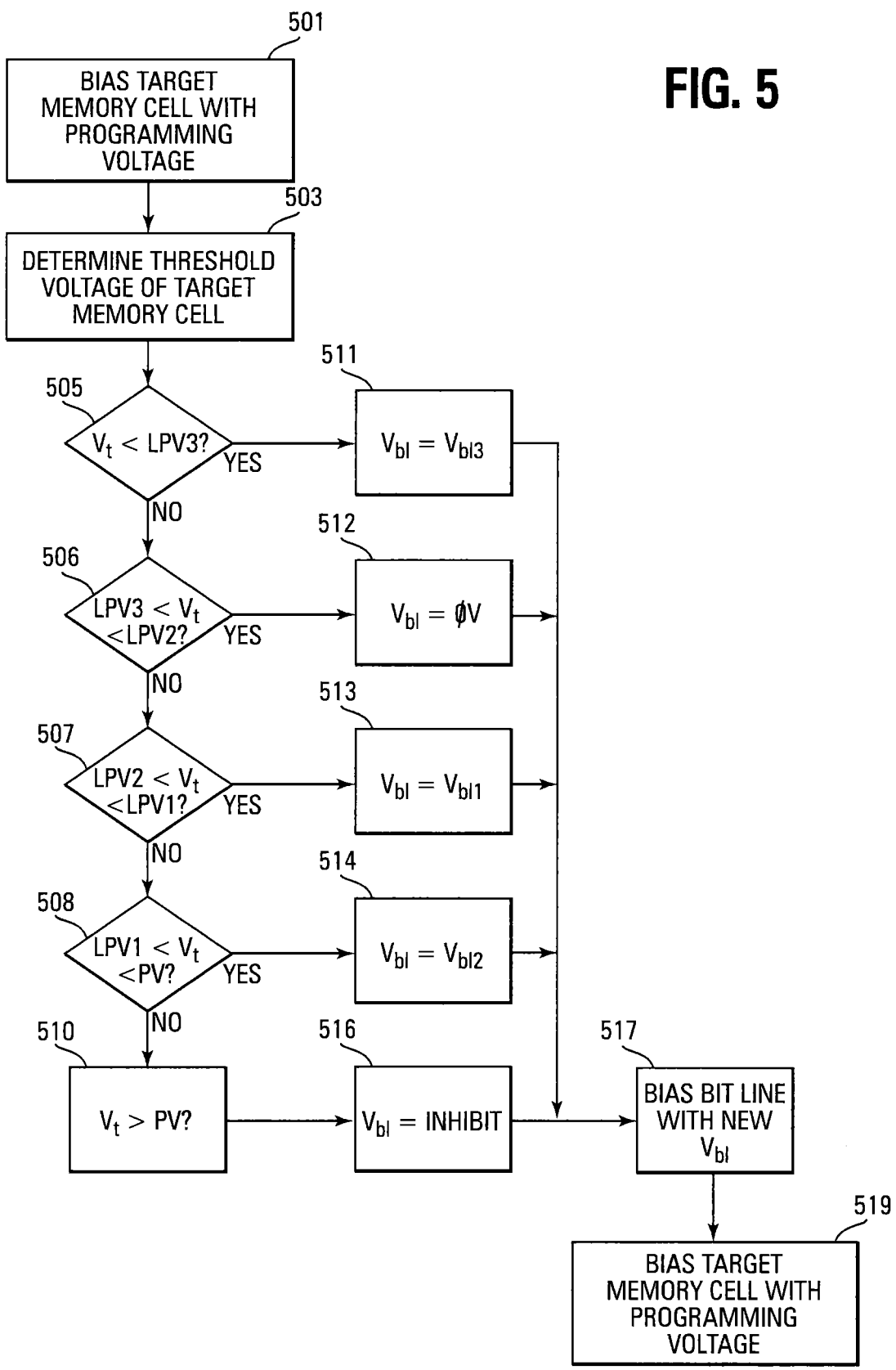
FIG. 5 shows a flowchart of one embodiment of a method for programming and program verify that incorporates multiple level verification.

FIG. 5 illustrates a flowchart of one embodiment of a method for programming and program verifying in a memory device, such as the memory array of FIG. 4. This particular embodiment of a program and program verify method uses a four level verification as part of a program operation to determine how to bias the bit lines during a subsequent programming pulse. Other embodiments use a different number (e.g., three) of multiple level program verifications to determine how to bias the bit lines during a subsequent programming pulse. The subsequently described method refers to the programming and program verify of a single memory cell for the sake of clarity. However, a large number of memory cells on one or more selected word lines can be programmed and verified substantially simultaneously.

Different bit line biasing can be used to change the programming rate of memory cells. Typically, a bit line coupled to a memory cell being programmed is biased at 0V for normal programming and an inhibit voltage (e.g., supply voltage or $V_{CC}$) to stop the memory cells from programming once the memory cell has reached its target threshold voltage or if programming must be avoided (e.g., the memory cell has to be left in the erased state). Intermediate bit line voltages (e.g., higher than 0V and lower than the inhibit voltage) result in less programming, or reduced programming rate.

For example, a typical prior art programming of the memory array of FIG. 4 would comprise biasing BL1 at 0V and BL2 at $V_{CC}$. The bit line voltage is transferred to the selected string by turning on drain select gates 412, 413 through SG(D) control line 414. This would allow the addressed cell 430 in string of memory cells 404 coupled to the BL1 bit line to be programmed and inhibit the cell 431 in string of memory cells 405 coupled to the BL2 bit line. The programming operation would then apply an initial programming pulse (e.g., 16V) on a selected word line, such as WL28, while the other word lines are biased at a pass voltage $V_{pass}$ (e.g., 10V). Since the word line is coupled to a row of memory cells, the programming voltage is applied to the control gates of those memory cells in the row. However, only memory cell 430 would experience an increase in its threshold voltage since memory cell 431 is inhibited from being programmed by the bit line bias.

Referring to FIG. 5, the method initially biases a word line coupled to a target memory cell with a programming voltage 501. This can be done in the form of a programming pulse. The threshold voltage of the target memory cell is then determined 503 by sensing the voltage. The $V_t$ determination can be accomplished by four "read" operations at different WL voltages (LPV3, LPV2, LPV1 and PV, respectively). In a NAND memory, the BL is pre-charged and its voltage evaluated after a read time. The evaluation can entail determining the conductive (if BL discharges) or non-conductive (if BL remains charged) state of the cell. Alternate embodiments can use other techniques suited to establishing the cell's $V_t$ relationship versus. LPVn and PV. For example, by sensing the memory cell (e.g., reading it with respect to different program verify levels.

It is determined 505-508 where the threshold voltage is in relation to four verify levels: LPV1, LPV2, LPV3, and PV. The four verify levels (e.g., Low Program Verify 1 (LPV1), Low Program Verify 2 (LPV2), Low Program Verify 3 (LPV3), and Program Verify (PV)) define five different voltage ranges. The threshold voltage of the target memory cell will eventually be located in one of these voltage ranges. The first range is $V_t$<LPV3. The second range is LPV3<$V_t$<LPV2. The third range is LPV2<$V_t$<LPV1. The fourth range is LPV1<$V_t$<PV. The fifth range is $V_t$>PV.

The location of the threshold voltage $V_t$ with respect to these voltage ranges determines the subsequent bit line bias voltage for the bit line coupled to the target memory cell during a subsequent programming pulse. The subsequent bit line bias, in combination with the subsequent word line programming pulse, determines the speed at which the memory cell coupled to that particular bit line will program.

The PV level can be determined by the target state to which the target memory cell is being programmed. For example, if the target state is a logical 01, this state might be represented by a program verify voltage of 0.5V that is the low point of the target state distribution. Thus, PV would be 0.5V. The LPV1-LPV3 levels could then be determined as voltages that are less than PV. For example, LPV3<LPV2<LPV1<PV. In one embodiment, the LPV1-LPV3 levels can each be a percentage of the PV level. In another embodiment, the LPV1-LPV3 levels can each be a fixed voltage having the above relationship and determined by empirical testing of a memory device prior to manufacture.

If the determined (e.g., read) threshold voltage $V_t$ is less than the lowest program verify level LPV3 505, the subsequent bit line voltage (e.g., new bit line voltage) will be a first bit line voltage (e.g., $V_{bl3}$) 511. In one embodiment, $V_{bl3}$ is a voltage that is between a reference potential (e.g., 0V) and an inhibit voltage (e.g., supply voltage). $V_{bl3}$ can be the same voltage as $V_{bl1}$. This voltage can be determined by empirical testing of a memory device prior to manufacture in order to provide a desired speed of movement of the threshold voltages in this particular range.

If the determined threshold voltage $V_t$ is in the range of LPV3<$V_t$<LPV2 506, the subsequent bit line voltage will be a ground potential (e.g., 0V) 512. This voltage provides the quickest movement of threshold voltages that are in this range. Thus, the memory cells that have these threshold voltages will program quicker than memory cells having other threshold voltages. The choice of $V_{bl3}$ is made in order to provide the desired programming speed increase when $V_t$ becomes larger than LPV3 (i.e., it transitions from the $V_t$<LPV3 range to the LPV3<$V_t$<LPV2 range). In fact, when this happens, there is a combined increase of programming voltages both on the WL (by $V_{step}$) and on the BL (from $V_{bl3}$ to 0V).

If the determined threshold voltage $V_t$ is in the range of LPV2<$V_t$<LPV1 507, the subsequent bit line voltage will be a second bit line voltage (e.g., $V_{bl1}$) 513. The subsequent bit line voltage $V_{bl1}$ is a voltage that is between a ground potential (e.g., 0V) and an inhibit voltage (e.g., supply voltage) so that, at the subsequent programming step, these memory cells will program at a reduced speed. In one embodiment the second bit line voltage is substantially the same voltage as the first bit line voltage $V_{bl3}$. In this last case, the speed acceleration when $V_t$ passes LPV3 is the same as the speed slow down when $V_t$ passes LPV2 but not LPV1.

If the determined threshold voltage $V_t$ is in the range of LPV1<$V_t$<PV 508, the subsequent bit line voltage will be a third bit line voltage $V_{bl2}$ 514. In one embodiment, $V_{bl2}$ is greater than $V_{bl1}$ and less than the inhibit voltage. $V_{bl2}$ can be determined in the same manner as $V_{bl1}$.

Once the determined threshold voltage $V_t$ is greater than the program verify threshold PV 510, the subsequent bit line voltage will be an inhibit voltage 516. Memory cells having a $V_t$ greater than the program verify threshold PV are considered programmed to their target state and further programming is inhibited so that their threshold voltages do not increase with further programming pulses.

After the new bit line voltage has been determined 511-516, the bit line coupled to the target memory cell is biased at this voltage 517. Substantially simultaneously with the bit line being biased at the new $V_{bl}$, a programming voltage (e.g., programming pulse) is applied to the word line 519. The threshold voltage of the target memory cell then increases by an amount that is determined by the programming pulse voltage and by $V_{bl}$.

Figure 6:
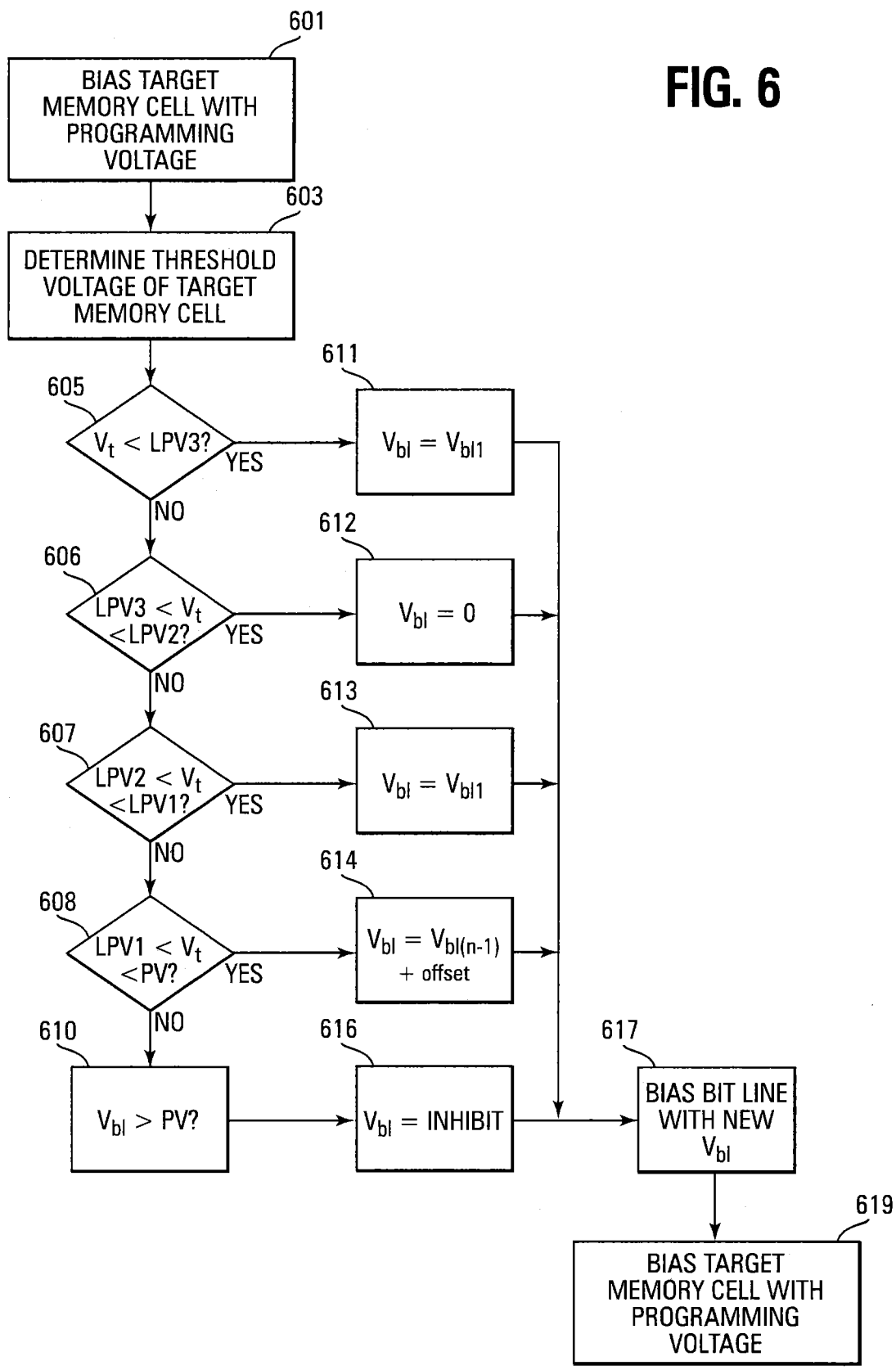
FIG. 6 shows a flowchart of an alternate embodiment of a method for programming and program verify that incorporates multiple level verification.

FIG. 6 illustrates a flowchart of an alternate embodiment of a method for program verify in a memory device, such as the memory array of FIG. 4. This embodiment is similar to the embodiment of FIG. 5 except a variable voltage is used in place of the $V_{bl2}$ bit line voltage. As subsequently described, the variable bit line voltage increases after each programming pulse during which the determined (e.g., read) threshold voltage $V_t$ is between LPV1 and PV.

Referring to FIG. 6, the method initially biases a word line coupled to a target memory cell with a programming voltage 601. This can be done in the form of a programming pulse. The threshold voltage of the target memory cell is then determined 603.

The location of the threshold voltage $V_t$ with respect to the four verify levels and, thus, the five voltage ranges determines the subsequent bit line voltage (e.g., new $V_{bl}$) during a subsequent programming pulse for the bit line coupled to the target memory cell. As previously discussed, the subsequent bit line voltage determines the speed at which the memory cell or cells coupled to that particular bit line will program.

If the determined threshold voltage $V_t$ is less than the lowest program verify level LPV3 605, the subsequent bit line voltage (e.g., new $V_{bl}$) will be a first bit line voltage (e.g., a first bit line programming voltage $V_{bl1}$) 611. In one embodiment, $V_{bl1}$ is a voltage that is between a ground potential (e.g., 0V) and an inhibit voltage (e.g., supply voltage). As in the previous embodiment, this voltage can be determined by empirical testing of a memory device prior to manufacture.

If the determined threshold voltage $V_t$ is in the range of LPV3<$V_t$<LPV2 606, the subsequent bit line voltage will be a ground potential (e.g., 0V) 612. This voltage provides the quickest movement of threshold voltages that are in this range. Thus, the memory cells that have these threshold voltages will program quicker than memory cells having other threshold voltages.

If the determined threshold voltage $V_t$ is in the range of LPV2<$V_t$<LPV1 607, the subsequent bit line voltage will be the first bit line voltage (e.g., $V_{bl1}$) 613. The subsequent bit line voltage $V_{bl1}$ is a voltage that is between a ground potential (e.g., 0V) and an inhibit voltage (e.g., supply voltage) so that, at the subsequent programming step, these memory cells will program at a reduced speed. This voltage can be determined as described previously.

If the determined threshold voltage $V_t$ is in the range of LPV1<$V_t$<PV 608, the subsequent bit line voltage will be a variable bit line voltage 614. In one embodiment, the variable bit line voltage can be determined by adding an offset (e.g., $\Delta V_t$) to a previous bit line voltage. For example, the $\Delta V_t$ can be a change in the threshold voltage that was experienced in response to the previous programming pulse. Each new bit line voltage is used to bias the bit line during a programming pulse until the threshold voltage for the target memory cell reaches the program verify level.

Another embodiment to determine the variable bit line voltage can add a constant to a previous bit line voltage. For example, the offset can be a constant of 0.1V that is added to each previous bit line voltage. Thus, if a first bit line voltage is $V_{bl1}$=0.2V, the next bit line voltage would be $V_{bl2}$=0.3V.

In another embodiment to determine the variable bit line voltage, the variable voltage can comprise a decreasing bit line voltage offset (e.g., $\Delta V_{bl}$) that is added to each previous bit line voltage. This can be represented by $V_{bl(n-1)}\Delta V_{bl(n-1)}/2$. For example, assuming a bit line is biased with the $V_{bln}$ voltages in the order of $V_{bl2}, V_{bl3}, V_{bl4}, V_{bl5} \ldots$, if the first bit line voltage $V_{bl2}$=0.2V and $\Delta V_{bl1}$=0.2V, the first bit line voltage, while the determined threshold voltage is between LPV1 and PV, will be $V_{bl2}$=0.2V+0.2V/2=0.3V. The second bit line voltage will be $V_{bl3}$=0.3V+0.1V/2=0.35V. The third bit line voltage will be $V_{bl4}$=0.35V+0.05V/2=0.375V. This decreasing offset addition can continue until the determined threshold voltage is at PV or greater. In one embodiment, the decreasing offset decreases by a factor different from 2 (e.g., larger or smaller).

Once the determined threshold voltage $V_t$ is greater than the program verify threshold PV 610, the subsequent bit line voltage will be an inhibit voltage 616. Memory cells having a $V_t$ greater than the program verify threshold PV are considered programmed to their target state and further programming is inhibited so that their threshold voltages do not increase with further programming pulses.

After the new bit line voltage has been determined 611-616, the bit line coupled to the target memory cell is biased at this voltage 617. Substantially simultaneously with the bit line being biased at the new $V_{bl}$, a programming voltage (e.g., programming pulse) is applied to the word line 619. The threshold voltage of the target memory cell then increases by an amount that is determined by the combination of the new $V_{bl}$ and the programming step voltage $V_{step}$. As is known in the art, $V_{step}$ is the program step voltage by which the word line programming voltage is increased for each subsequent programming pulse.

As one example of threshold voltage increases due to the new bit line voltage, if $V_{bl}=V_{bl1}$, such as when $V_t$<LPV3, the threshold voltage will increase by $V_{step}$. If $V_{bl}$ is increased by a variable offset, such as when LPV1<$V_t$<PV, the threshold voltage will increase by $V_{step}$ minus the variable offset (e.g., $\Delta V_t$ or $V_{offset}$). If $V_{bl}$=INHIBIT (e.g., $V_{CC}$), such as when $V_t$>PV, the threshold voltage is not increased. Fewer (e.g., three) or more (e.g., five) program verify levels may be used in some embodiments. For example the number of threshold voltage ranges may be limited to four ($V_t$<LPV3, LPV3<$V_t$<LPV1, LPV1<$V_t$<PV and $V_t$>PV) and operations 607 and 613 may be avoided.

Figure 7:
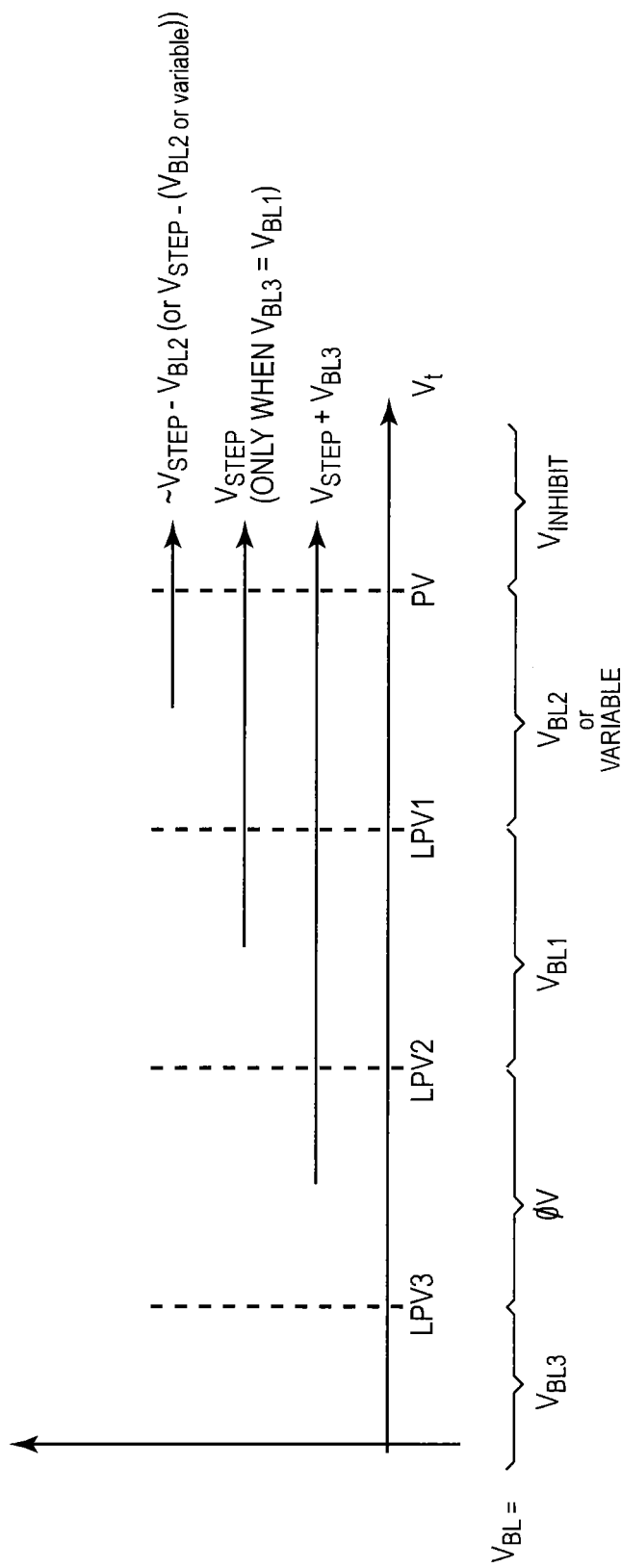
FIG. 7 shows a result of threshold voltage $V_t$ movement in accordance with the methods of FIGS. 5 and 6.

FIG. 7 illustrates a threshold voltage diagram showing the relationship of the different verify levels and the voltage ranges created by these levels. The bit line voltage $V_{bl}$ that can be used for each voltage range is also shown below the appropriate threshold voltage range.

While the diagram of FIG. 7 and the above description of one embodiment assigns the variable voltage to the LPV1<$V_t$<PV range, alternate embodiments can assign the variable $V_{bl}$ to other voltage ranges as well. For example, one embodiment might use the variable $V_{bl}$ with both the LPV2<$V_t$<LPV1 and LPV1<$V_t$<PV ranges.

Figure 8:
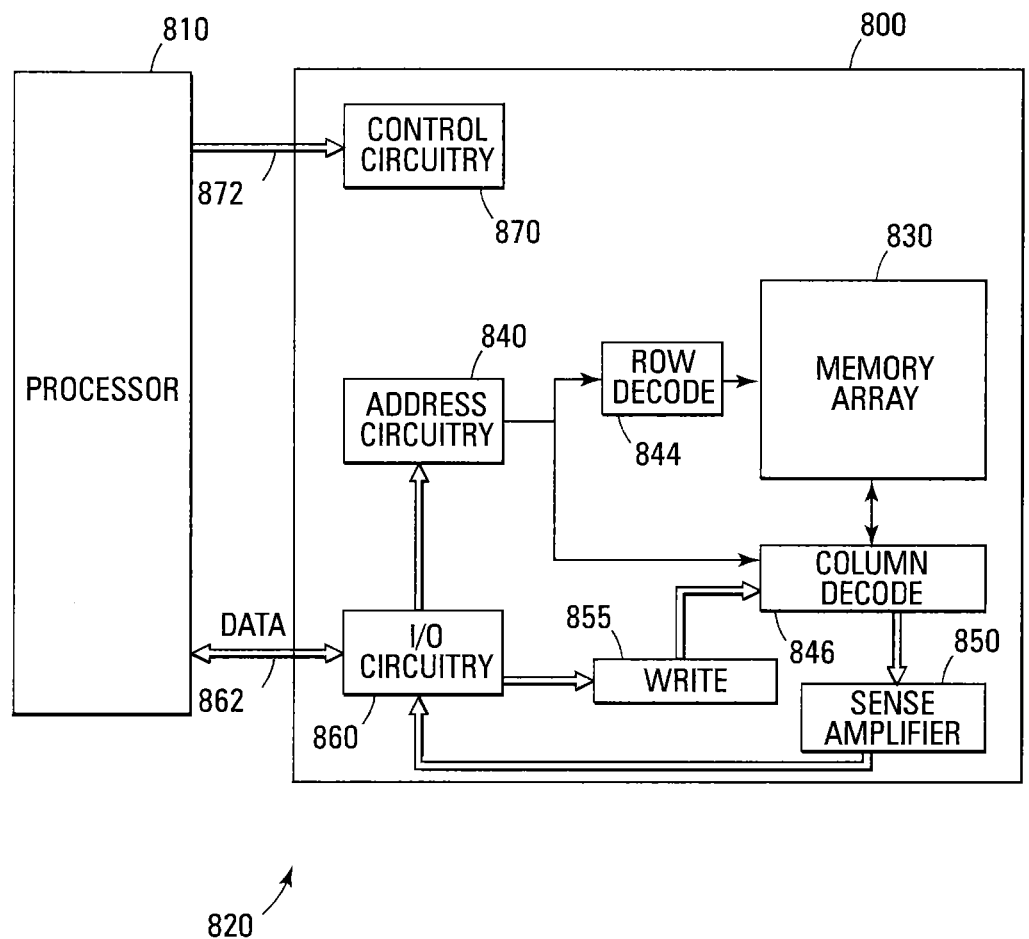
FIG. 8 shows a block diagram of one embodiment of a memory system.

FIG. 8 illustrates a functional block diagram of a memory device 800. The memory device 800 is coupled to an external processor 810. The processor 810 may be a microprocessor or some other type of controller. The memory device 800 and the processor 810 form part of a memory system 820. The memory device 800 has been simplified to focus on features of the memory that are helpful in understanding the present invention.

The memory device 800 includes an array 830 of non-volatile memory cells, such as the one illustrated previously in FIG. 4. The memory array 830 is arranged in banks of word line rows and bit line columns. In one embodiment, the columns of the memory array 830 are comprised of series strings of memory cells. As is well known in the art, the connections of the cells to the bit lines determines whether the array is a NAND architecture, an AND architecture, or a NOR architecture.

Address buffer circuitry 840 is provided to latch address signals provided through the I/O circuitry 860. Address signals are received and decoded by a row decoder 844 and a column decoder 846 to access the memory array 830. It will be appreciated by those skilled in the art, with the benefit of the present description, that the number of address input connections depends on the density and architecture of the memory array 830. The number of addresses increases with both increased memory cell counts and increased bank and block counts.

The memory device 800 reads data in the memory array 830 by sensing voltage or current changes in the memory array columns using sense amplifier circuitry 850. The sense amplifier circuitry 850, in one embodiment, is coupled to read and latch a row of data from the memory array 830. Data input and output buffer circuitry 860 is included for bidirectional data communication as well as address communication over a plurality of data connections 862 with the controller 810. Write circuitry 855 is provided to write data to the memory array.

Memory control circuitry 870 decodes signals provided on control connections 872 from the processor 810. These signals are used to control the operations on the memory array 830, including data read, data write (program), and erase operations. The memory controller circuitry 870 may be a state machine, a sequencer, or some other type of controller to generate the memory control signals. In one embodiment, the memory control circuitry 870 is configured to execute the programming and multiple level (e.g., four level) program verify method of the present embodiments, such as in order to tighten $V_t$ distributions.

The flash memory device illustrated in FIG. 8 has been simplified to facilitate a basic understanding of the features of the memory. A more detailed understanding of internal circuitry and functions of flash memories are known to those skilled in the art.

CONCLUSION

One or more embodiments can change a data line (e.g., bit line) voltage for subsequent programming pulses based on the location of the threshold voltage of the target memory cell in relation to multiple (N) verify levels. The N multiple verify levels define N+1 program verify voltage ranges. Each voltage range is assigned a data line voltage that will be used in a subsequent programming operation when the present threshold voltage of the target memory cell is located within that particular voltage range. In some embodiments, the data line voltage is decreased based, at least in part, on the threshold voltage transitioning from one program verify voltage range to another range. In one or more embodiments, four verify levels are used, defining five program verify voltage ranges.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is intended that this invention be limited only by the following claims and equivalents thereof.

What is claimed is:

1. A method for a multiple level program verify of a memory cell, the method comprising:
   determining a threshold voltage of the memory cell, after applying a programming voltage, in relation to multiple program verify levels; and
   decreasing a data line voltage, of a data line coupled to the memory cell, for a subsequent application of a programming voltage in response to a relation of the determined threshold voltage to the multiple program verify levels.

2. The method of claim 1 wherein the multiple program verify levels comprise four program verify levels.

3. A method for a multiple level program verify of a memory cell, the method comprising:
   determining a threshold voltage of the memory cell, after applying a programming voltage, in relation to multiple program verify levels; and
   decreasing a data line voltage, of a data line coupled to the memory cell, for a subsequent application of a programming voltage in response to a relation of the determined threshold voltage to the multiple program verify levels;
   wherein decreasing a data line voltage comprises:
      biasing a data line to a first data line voltage based, at least in part, on the determined threshold voltage of the memory cell being lower than a first program verify level; and
      biasing the data line to a second data line voltage lower than the first data line voltage based, at least in part, on the determined threshold voltage of the memory cell being higher than said first program verify level.

4. The method of claim 3 wherein the second data line voltage is a reference voltage.

5. The method of claim 4 wherein the first data line voltage is a positive voltage and the second data line voltage is a ground voltage.

6. The method of claim 1 and further comprising biasing the data line with an inhibit voltage when the determined threshold voltage is greater than all of the program verify levels.

7. The method of claim 2 wherein the at least four program verify levels define five voltage ranges.

8. The method of claim 7 wherein two of the five voltage ranges are assigned a same data line voltage.

9. A method for a multiple level program verify of a memory cell, the method comprising:
determining a threshold voltage of the memory cell, after applying a programming voltage, in relation to multiple program verify levels; and
decreasing a data line voltage, of a data line coupled to the memory cell, for a subsequent application of a programming voltage in response to a relation of the determined threshold voltage to the multiple program verify levels;
wherein the multiple program verify levels comprise at least four program verify levels;
wherein the at least four program verify levels define five voltage ranges; and
increasing the data line voltage by a constant voltage for each subsequent application of a programming voltage that the threshold voltage is in a first voltage range of the five voltage ranges.

10. The method of claim 2 wherein the at least four program verify levels comprise PV, LPV1, LPV2, and LPV3 such that LPV3<LPV2<LPV1<PV.

11. The method of claim 10 wherein the PV program verify level is a representative voltage of a target state to which the memory cell is to be programmed.

12. The method of claim 11 wherein the PV program verify level is a voltage at a low point of the target state.

13. A method for multiple level program verify in a memory device, the method comprising:
applying a programming pulse to control gates of a plurality of memory cells while applying a data line voltage to a data line coupled to a memory cell of the plurality of memory cells;
determining a threshold voltage of the memory cell, after the programming pulse, in relation to four program verify levels; and
applying a subsequent data line voltage to the data line coupled to the memory cell of the plurality of memory cells for each subsequent programming pulse while the threshold voltage is greater than a lowest program verify level of the four program verify levels and less than a greatest program verify level of the four program verify levels;
wherein applying the subsequent data line voltage further comprises applying a subsequent data line voltage that is higher than said applied data line voltage in response to the determined threshold voltage relative to the multiple program verify levels.

14. The method of claim 13 wherein determining the threshold voltage comprises sensing the memory cell.

15. The method of claim 13 wherein the subsequent data line voltage that is higher than said applied data line voltage comprises a constant voltage added to the applied data line voltage.

16. The method of claim 13 further comprising increasing the data line voltage, in response to a previous data line voltage, at a decreasing rate.

17. The method of claim 16 wherein the data line voltage is increased by $\Delta V_{b1(n-1)}/2$, wherein $\Delta V_{b1(n-1)}$ is a data line voltage offset of the previous data line voltage.

18. The method of claim 13 wherein each of the program verify levels lower than the greatest program verify level is a percentage of the greatest program verify level.

19. A memory device comprising:
a memory array; and
control circuitry configured to cause a subsequent data line voltage to be applied for a subsequent application of a programming voltage to a target memory cell of the array responsive to a determined relationship of a threshold voltage of the target memory cell of the array with respect to a plurality of program verify voltage ranges;
wherein the control circuitry is configured to increase a previous data line voltage, applied during a previous application of a programming voltage to the target memory cell, to the subsequent data line voltage in response to the determined relationship of the threshold voltage of the target memory cell with respect to the plurality of program verify voltage ranges.

20. The memory device of claim 19 wherein the plurality of program verify voltage ranges comprise five program verify voltage ranges.

21. A memory device comprising:
a memory array; and
control circuitry configured to cause a subsequent data line voltage to be applied for a subsequent application of a programming voltage to a target memory cell of the array responsive to a determined relationship of a threshold voltage of the target memory cell of the array with respect to a plurality of program verify voltage ranges;
wherein the plurality of program verify voltage rages comprise at least five program verify voltage ranges defined by program verify voltages PV, LPV1, LPV2, and LPV3 having a relationship of LPV3<LPV2<LPV1<PV wherein PV is a target program verify level and further wherein the control circuitry being configured to cause the subsequent data line voltage to be applied comprises causing a $\Delta V_t$ to be added to a previous data line voltage when the threshold voltage is between LPV1 and PV wherein the $\Delta V_t$ is a change in a threshold voltage responsive to application of the programming voltage.

22. The memory device of claim 21 wherein the subsequent data line voltage comprises a first data line voltage when the threshold voltage is between LPV1 and PV and a second data line voltage when the threshold voltage is between LPV2 and LPV1 wherein the first data line voltage is greater than the second data line voltage.

23. The memory device of claim 22 wherein the subsequent data line voltage comprises the first data line voltage when the threshold voltage is less than LPV3.

24. The memory device of claim 21 wherein the subsequent data line voltage comprises a variable data line voltage when the threshold voltage is between LPV1 and PV.

* * * * *

UNITED STATES PATENT AND TRADEMARK OFFICE
CERTIFICATE OF CORRECTION

PATENT NO. : 8,670,273 B2
APPLICATION NO. : 13/204029
DATED : March 11, 2014
INVENTOR(S) : Seiichi Aritome et al.

It is certified that error appears in the above-identified patent and that said Letters Patent is hereby corrected as shown below:

In the Claims

In column 10, line 39, in Claim 21, delete "rages" and insert -- ranges --, therefor.

Signed and Sealed this
Fifth Day of August, 2014

Michelle K. Lee
*Deputy Director of the United States Patent and Trademark Office*